United States Patent
Pikulin

(10) Patent No.: US 11,010,684 B2
(45) Date of Patent: May 18, 2021

(54) QUANTUM SPIN HALL-BASED CHARGING ENERGY-PROTECTED QUANTUM COMPUTATION

(71) Applicant: Microsoft Technology Licensing, LLC, Redmond, WA (US)

(72) Inventor: Dmitry I. Pikulin, Goleta, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 158 days.

(21) Appl. No.: 16/195,579

(22) Filed: Nov. 19, 2018

(65) Prior Publication Data

US 2019/0220769 A1     Jul. 18, 2019

Related U.S. Application Data

(60) Provisional application No. 62/588,424, filed on Nov. 19, 2017.

(51) Int. Cl.
*G06N 10/00* (2019.01)
*H01L 43/04* (2006.01)
*H01L 43/06* (2006.01)
*H01L 49/00* (2006.01)

(52) U.S. Cl.
CPC ............. *G06N 10/00* (2019.01); *H01L 43/04* (2013.01); *H01L 43/065* (2013.01); *H01L 49/003* (2013.01); *H01L 49/006* (2013.01)

(58) Field of Classification Search
CPC ....... G06N 10/00; H01L 43/04; H01L 43/065; H01L 49/003; H01L 49/006
See application file for complete search history.

(56) References Cited

U.S. PATENT DOCUMENTS

| 3,578,968 A | 5/1971 | Hellwig |
| 7,109,593 B2 | 9/2006 | Freedman et al. |
| 7,250,624 B1 | 7/2007 | Freedman et al. |
| 8,209,279 B2 | 6/2012 | Freedman et al. |

(Continued)

FOREIGN PATENT DOCUMENTS

EP     3566186     11/2019

OTHER PUBLICATIONS

Ginossar et al. ("Microwave transitions as a signature of coherent parity mixing effects in the Majorana-transmon qubit," Nature Communications, pp. 1-8, 2014) (Year: 2014).*

(Continued)

*Primary Examiner* — Yasser A Abdelaziez
(74) *Attorney, Agent, or Firm* — Klarquist Sparkman, LLP

(57) ABSTRACT

This application concerns quantum computing, and in particular to structures and mechanisms for providing topologically protected quantum computation. In certain embodiments, a magnetic tunnel barrier is controlled that separates Majorona zero modes ("MZMs") from an edge area (e.g., a gapless edge) of a quantum spin hall system. In particular implementations, the magnetic tunnel barrier is formed from a pair of magnetic insulators whose magnetization is held constant, and the magnetic tunnel barrier is tuned by controlling a gate controlling the electron density around the magnetic insulator in the QSH plane, thereby forming a quantum dot. And, in some implementations, a state of the quantum dot is read out (e.g., using a charge sensor as disclosed herein).

20 Claims, 7 Drawing Sheets

(56) References Cited

U.S. PATENT DOCUMENTS

| | | | |
|---|---|---|---|
| 8,583,903 | B2 | 11/2013 | Freedman et al. |
| 8,620,855 | B2 | 12/2013 | Bonderson |
| 9,256,834 | B2 | 2/2016 | Bonderson et al. |
| 9,517,931 | B2 | 12/2016 | Freedman et al. |
| 9,755,133 | B1* | 9/2017 | Nayfeh ................... H01L 27/18 |
| 2003/0057441 | A1 | 3/2003 | Ivanov et al. |
| 2006/0043423 | A1 | 3/2006 | Freedman et al. |
| 2006/0045269 | A1 | 3/2006 | Freedman et al. |
| 2006/0091375 | A1 | 5/2006 | Freedman et al. |
| 2007/0080339 | A1 | 4/2007 | Freedman et al. |
| 2007/0162407 | A1 | 7/2007 | Freedman et al. |
| 2009/0079421 | A1 | 3/2009 | Freedman et al. |
| 2012/0112168 | A1 | 5/2012 | Bonderson et al. |
| 2012/0221268 | A1 | 8/2012 | Freedman et al. |
| 2014/0050475 | A1 | 2/2014 | Bonderson et al. |
| 2014/0214257 | A1 | 7/2014 | Williams et al. |
| 2014/0221059 | A1 | 8/2014 | Freedman et al. |
| 2014/0279822 | A1* | 9/2014 | Bonderson ............ G06N 10/00 706/62 |
| 2016/0148112 | A1* | 5/2016 | Kwon ..................... H01L 27/18 257/31 |
| 2017/0091649 | A1 | 3/2017 | Clarke et al. |
| 2017/0141287 | A1* | 5/2017 | Barkeshli ............. H01L 39/223 |
| 2017/0161632 | A1 | 6/2017 | Freedman et al. |
| 2018/0052806 | A1* | 2/2018 | Hastings ................ G06N 10/00 |
| 2018/0053113 | A1 | 2/2018 | Lutchyn et al. |
| 2018/0053809 | A1 | 2/2018 | Freedman et al. |
| 2019/0013457 | A1* | 1/2019 | Lutchyn ................ B82Y 10/00 |
| 2020/0098821 | A1 | 3/2020 | Freedman et al. |

OTHER PUBLICATIONS

Aasen et al. ("milstones toward Majorana-Based Quantum Computing," Physical Review X 6, 031016, 2016) (Year: 2016).*
Bernevig et al. ("Quantum Spin Hall Effect and Topological Phase Transition in HgTe Quantum Wells." Science, vol. 314, pp. 1757-1761, Dec. 15, 2006) (Year: 2006).*
Notice of Allowance dated May 11, 2020, from U.S. Appl. No. 16/680,192, 11 pp.
Aaronson, "Quantum Computing, Postselection, and Probabilistic Polynomial-Time," *Proc. Royal Society of London A: Mathematical, Physical and Engineering Sciences*, vol. 461, No. 2063, pp. 1-9 (Nov. 2005).
Aasen et al., "Milestones toward Majorana-based quantum computing," *Physical Review X*, pp. 1-27 (Aug. 2016).
Abrams et al., "Nonlinear quantum mechanics implies polynomial-time solution for NP-complete and #P problems," arXiv:quant-ph/9801041v1, pp. 1-10 (Jan. 1998).
Alicea et al., "Non-Abelian statistics and topological quantum information processing in 1D wire networks," *Nature Physics*, vol. 7, Issue 5, pp. 412-417 (May 2011).
Bolech et al., "Observing Majorana Bound States in p-wave Superconductors Using Noise Measurements in Tunneling Experiments," *Physical Review Letters*, vol. 98, pp. 1-4 (Jun. 2007).
Bonderson et al., "Detecting Non-Abelian Statistics in the $v=5/2$ Fractional Quantum Hall State," *Physical Review Letters*, vol. 96, No. 1, pp. 1-5 (Jan. 2006).
Bonderson et al., "Measurement-Only Topological Quantum Computation," *Physical Review Letters*, vol. 101, No. 1, pp. 1-4 (Feb. 2008).
Bonderson et al., "Measurement-Only Topological Quantum Computation via Tunable Interactions," *Physical Review B*, vol. 87, No. 3, pp. 1-10 (Jan. 2013).
Bonderson, "Non-Abelian Anyons and Interferometry," Ph.D. Thesis, California Institute of Technology, pp. 1-138 (May 2007).
Bonderson et al., "Quasi-Topological Phases of Matter and Topological Protection," *Physical Review B*, vol. 87, pp. 1-27 (May 2013).
Bravyi et al., "Magic state distillation with low overhead," *Physical Review A*, vol. 48, pp. 1-11 (Nov. 2012).
Bravyi et al., "Universal quantum computation with ideal Clifford gates and noisy ancillas," *Physical Review A*, vol. 71, pp. 1-14 (Feb. 2005).
Bravyi, "Universal Quantum Computation with the $v=5/2$ Fractional Quantum Hall State," *Physical Review A*, vol. 73, No. 4, pp. 1-17 (Nov. 2005).
Chen et al., "Surface Plasmon Enhanced Sensitive Detection for Possible Signature of Majorana Fermions via a Hybrid Semiconductor Quantum Dot-Metal Nanoparticle System," *Journal of Scientific Reports*, vol. 5, pp. 1-11 (Aug. 2015).
Das Sarma et al., "Topologically-Protected Qubits from a Possible Non-Abelian Fractional Quantum Hall State," *Physical Review Letters*, vol. 94, No. 16, pp. 1-5 (Dec. 2004).
Domanski et al., "Constructive influence of the induced electron pairing on the Kondo state," *Journal of Scientific Reports*, vol. 6, pp. 1-12 (Mar. 2016).
Fidkowski et al., "From String Nets to Nonabelions," *Communications in Mathematical Physics*, vol. 287, No. 3, pp. 1-13 (Oct. 2006).
Freedman et al., "A Modular Functor Which is Universal for Quantum Computation," *Communications in Mathematical Physics*, vol. 227, No. 3, pp. 605-622 (Jun. 2002).
Freedman et al., "Simulation of topological field theories by quantum computers," Microsoft Research Technical Report MSR-TR-2000-27, pp. 1-26 (Apr. 2000).
Freedman et al., "The Two-Eigenvalue Problem and Density of Jones Representation of Braid Groups," *Communications in Mathematical Physics*, vol. 228, No. 1, pp. 177-199 (Jun. 2002).
Freedman et al., "Topological Quantum Computation," *Bulletin of the American Mathematical Society*, vol. 40, No. 1, pp. 31-38 (Oct. 2002).
Freedman et al., "Towards Universal Topological Quantum Computation in the $v=5/2$ Fractional Quantum Hall State," *Physical Review B*, vol. 73, No. 24, pp. 1-23 (Dec. 2005).
Gottesman, "A Theory of Fault-Tolerant Quantum Computation," *Physical Review A*, vol. 57, pp. 1-30 (Jan. 1998).
Hou et al., "'Wormhole' Geometry for Entrapping Topologically Protected Qubits in Non-Abelian Quantum Hall States and Probing Them with Voltage and Noise Measurements," *Physical Review Letters*, vol. 97, No. 14, pp. 1-4 (Oct. 2006).
Hyart et al., "Flux-controlled quantum computation with Majorana fermions," *Physical Review B*, vol. 88, No. 3, pp. 1-20 (Jul. 2013).
International Search Report and Written Opinion dated Mar. 31, 2009, from International Patent Application No. PCT/US08/75518, 10 pp.
International Search Report and Written Opinion dated Nov. 20, 2017, from International Patent Application No. PCT/US2017/047417, 16 pp.
Janzing et al., "BQP-complete Problems Concerning Mixing Properties of Classical Random Walks on Sparse Graphs," arXiv:quant-ph/0610235v2, pp. 1-24 (Oct. 2006).
Karzig et al., "A universal geometric path to a robust Majorana magic gate," *Physical Review X*, vol. 6, pp. 1-14 (Aug. 2016).
Karzig et al., "Scalable designs for quasiparticle-poisoning-protected topological quantum computation with Majorana zero modes," *Physical Review B*, vol. 95, Issue 23, pp. 1-32 (Jun. 2017).
Kauffman et al., "Braiding operators are universal quantum gates," *New Journal of Physics*, pp. 1-40 (Oct. 2004).
Kitaev, "Fault-tolerant quantum computation by anyons," *Journal of Annals Physics*, vol. 303, Issue 1, pp. 1-27 (Jul. 1997).
Klinovaja et al., "Electric-Field Induced Majorana Fermions in Armchair Carbon Nanotubes," *Physical Review Letters*, vol. 108, pp. 1-5 (May 2012).
Knill, "Quantum Computing with Very Noisy Devices," *Journal of Nature*, vol. 434, No. 7029, pp. 1-47 (Mar. 2005).
Landau et al., "Towards realistic implementations of a Majorana surface code," *Physical Review Letters*, vol. 116, Issue 5, pp. 1-5 (Feb. 2016).
Law et al., "Electronic Mach-Zehnder interferometer as a tool to probe fractional statistics," *Physical Review B*, vol. 74, No. 4, pp. 1-22 (Apr. 2006).
Lee et al., "Electrical manipulation of Majorana fermions in an interdigitated superconductor-ferromagnet device," *Physical Review Letters*, vol. 109, pp. 1-5 (Sep. 2012).

(56) References Cited

OTHER PUBLICATIONS

Lopes et al., "Algebraic treatment of the Stark effect for hydrogen," *Journal of Nuovo Cimento B*, vol. 3, Issue 23, pp. 1-3 (May 1971).
Maier et al., "Majorana fermions in Ge/Si hole nanowires," *Physical Review B*, vol. 90, pp. 1-11 (Nov. 2014).
Mizushima et al., "Symmetry-Protected Topological Superfluids and Superconductors—From the Basics to $^3$He -" *Journal of Physical Society of Japan,* vol. 85, Issue 2, pp. 1-82 (Jan. 2016).
Mourik et al., "Signatures of Majorana fermions in hybrid superconductor-semiconductor nanowire devices," *Journal of Science*, vol. 336, Issue 6084, pp. 1-28 (May 2012).
Mravlje, "Anyons in the fractional quantum Hall effect," Seminar, University of Ljubljana, pp. 1-14 (Jan. 2005).
Nayak et al., "Non-Abelian Anyons and Topological Quantum Computation," *Journal Reviews of Modern Physics*, vol. 80, No. 3, pp. 1-73 (Mar. 2008).
Nijholt et al., "Orbital effect of magnetic field on the Majorana phase diagram," *Physical Review B,* pp. 1-6 (Jun. 2016).
Office Action dated Aug. 29, 2011, from U.S. Appl. No. 12/187,850, 22 pp.
Office Action dated Oct. 28, 2015, from U.S. Appl. No. 13/465,374, 17 pp.
Office Action dated Feb. 26, 2018, from U.S. Appl. No. 15/376,539, 8 pp.
Palmer et al., "Entanglement detection and fractional quantum Hall effect in optical lattices," Ph.D. Thesis, Merton College, pp. 1-108 (Jan. 2007).
Pientka et al., "Signatures of topological phase transitions in mesoscopic superconducting rings," *New Journal of Physics,* vol. 15, pp. 1-14 (Feb. 2013).
Plugge et al., "Roadmap to Majorana surface codes," *Physical Review,* vol. 94, Issue 17, pp. 1-23 (Jun. 2016).
Preskill, "Lecture Notes for Ph219/CS219: Quantum Informaton and Computation Chapter 5," downloaded from: http://www.theory.caltech.edu/people/preskill/ph229, pp. 1-56 (Jul. 2015).
Raussendorf et al., "Quantum computing via measurements only," arXiv:quant-ph/0010033v1, pp. 1-4 (Oct. 2007).
Schneiderman et al., "Quasiparticle Poisoning in a Single Cooper-Pair Box," *AIP Conf. Proc.*, pp. 1-2 (Sep. 2006).
Smirnov, "Nonequilibrium Majorana fluctuations," *Journal of Mesoscale and Nanoscale Physics*, pp. 1-5 (Jun. 2017).
Vuik et al., "Effects of the electrostatic environment on the Majorana nanowire devices," *New Journal of Physics*, vol. 18, pp. 1-15 (Mar. 2016).
Beenakker, "Search for Majorna fermions in superconductors," arXiv:1112.1950v2, 15 pp. (Apr. 2012).
International Search Report and Written Opinion dated Mar. 4, 2019, from International Patent Application No. PCT/US2018/061849, 19 pp.
Lutchyn et al., "Majorana zero modes in superconductor-semiconductor heterostructures," *Nature Reviews Materials*, vol. 3, No. 5, pp. 52-68 (May 2018).
Shuo et al., "Proposal for the detection and braiding of Majorana fermions in a quantum spin Hall insulator," *Physical Review B,* vol. 87, No. 24, 5 pp. (Jun. 2013).
Timm, "Transport through a quantum spin Hall quantum dot," arXiv:111.2245v1, 12 pp. (Nov. 2011).
Albrecht et al., "Exponential protection of zero modes in Majorana islands," *Nature*, 531:206-223 (Mar. 10, 2016).
Lutchyn et al., "Realizing Majorana zero modes in superconductor-semiconductor heterostructures," arXiv:1707.04899v2, 20 pp. (Feb. 24, 2018).
Qi et al., "Topological insulators and superconductors," arXiv:1008.2026v1, 54 pp. (Aug. 12, 2010).

\* cited by examiner

QUANTUM SPIN HALL-BASED CHARGING ENERGY-PROTECTED QUANTUM COMPUTATION

CROSS-REFERENCE TO RELATED APPLICATIONS

This application claims the benefit of U.S. Provisional Application No. 62/588,424 entitled "QUANTUM SPIN HALL-BASED CHARGING ENERGY-PROTECTED QUANTUM COMPUTATION" and filed on Nov. 19, 2017, which is hereby incorporated herein by reference.

FIELD

This application concerns quantum computing, and in particular to structures and mechanisms for providing topologically protected quantum computation.

BACKGROUND

Quantum spin Hall ("QSH") systems provide a natural pathway towards the realization of Majorana zero modes ("MZMs") in a condensed matter system, and are a viable platform for the realization of topological quantum computation. Proposals to have topological quantum computation in QSH systems so far (see, e.g., S. Mi et al., Phys. Rev. B 87, 241405(R) (2013)) suffer from: (a) limited scalability due to the 1d structure of the QSH edge; (b) they are not charging-energy-protected; and (c) they require tuning by a magnetic field. Accordingly, improved QSH systems that are scalable, charging-energy-protected and/or free of an external magnetic field are desired.

SUMMARY

As noted, current approaches for providing topological quantum computation in a QSH system suffer from: (a) limited scalability due to the 1d structure of the QSH edge; (b) they are not charging energy-protected; and (c) they require tuning of magnetic field. Embodiments of the disclosed technology address one or more of these issues by providing a patterning of the QSH device in a regular manner, which allows scaling to arbitrary large systems and allows all protected operations. Further, embodiments of the disclosed technology are arranged so that the design can be implemented in a charging energy-protected way. Also disclosed herein are embodiments that provide a new way to connect and disconnect the MZMs necessary to perform the quantum computation in such systems. For example, certain embodiments use QSH systems gated into bulk conduction regions.

In certain embodiments, a magnetic tunnel barrier is controlled that separates Majorona zero modes ("MZMs") from an edge area (e.g., a gapless edge) of a quantum spin hall system. For example, the magnetic tunnel barrier can be formed by a magnetic insulator whose magnetization is held constant, and such magnetic tunnel barrier can be tuned by controlling a gate in the area of the magnetic insulator. Two of such tunnel barriers can form a quantum dot located between them. The state of the quantum dot can be read out (e.g., using a charge sensor). In further implementations, a tetron qubit is formed from the quantum spin Hall system. In some instances, the tetron qubit does not comprise a Josephson junction. The tunable quantum dot can be located between or substantially between two magnetic insulators. In certain implementations, the two magnetic insulators are non-tunable. In other embodiments, a hexon qubit is formed from the quantum spin Hall system. In some instances, the hexon qubit does not comprise a Josephson junction. The tunable quantum dot can be located between or substantially between two magnetic insulators. Further, in certain implementations, the two magnetic insulators are non-tunable.

Further embodiments of the disclosed technology include a tetron qubit with an extra island containing a pair of Majorana zero modes. Such a qubit comprises three pairs of Majorana zero modes, where the qubit further comprises tunable quantum dots configured to control a magnetic tunnel barrier between two neighboring Majorana zero modes. In some embodiments, the tetron qubit does not comprise a Josephson junction. In certain embodiments, the tunable quantum dots are further located between or substantially between two magnetic insulators (e.g., in some implementations, the two magnetic insulators are non-tunable). In further embodiments, the tetron qubit is part of a topologically protected quantum computing system.

Other embodiments of the disclosed technology include a hexon qubit and a coherent link comprising four pairs of Majorana zero modes, wherein the hexon qubit further comprises a tunable quantum dots configured to control a magnetic tunnel barrier between two neighboring Majorana zero modes. In some embodiments, the hexon qubit does not comprise a Josephson junction. In certain embodiments, the tunable quantum dot is further located between or substantially between two magnetic insulators (e.g., in some implementations, the two magnetic insulators are non-tunable). In further embodiments, the hexon qubit is part of a topologically protected quantum computing system.

The foregoing and other objects, features, and advantages of the disclosed technology will become more apparent from the following detailed description, which proceeds with reference to the accompanying figures.

DETAILED DESCRIPTION

I. General Considerations

Figure 1:
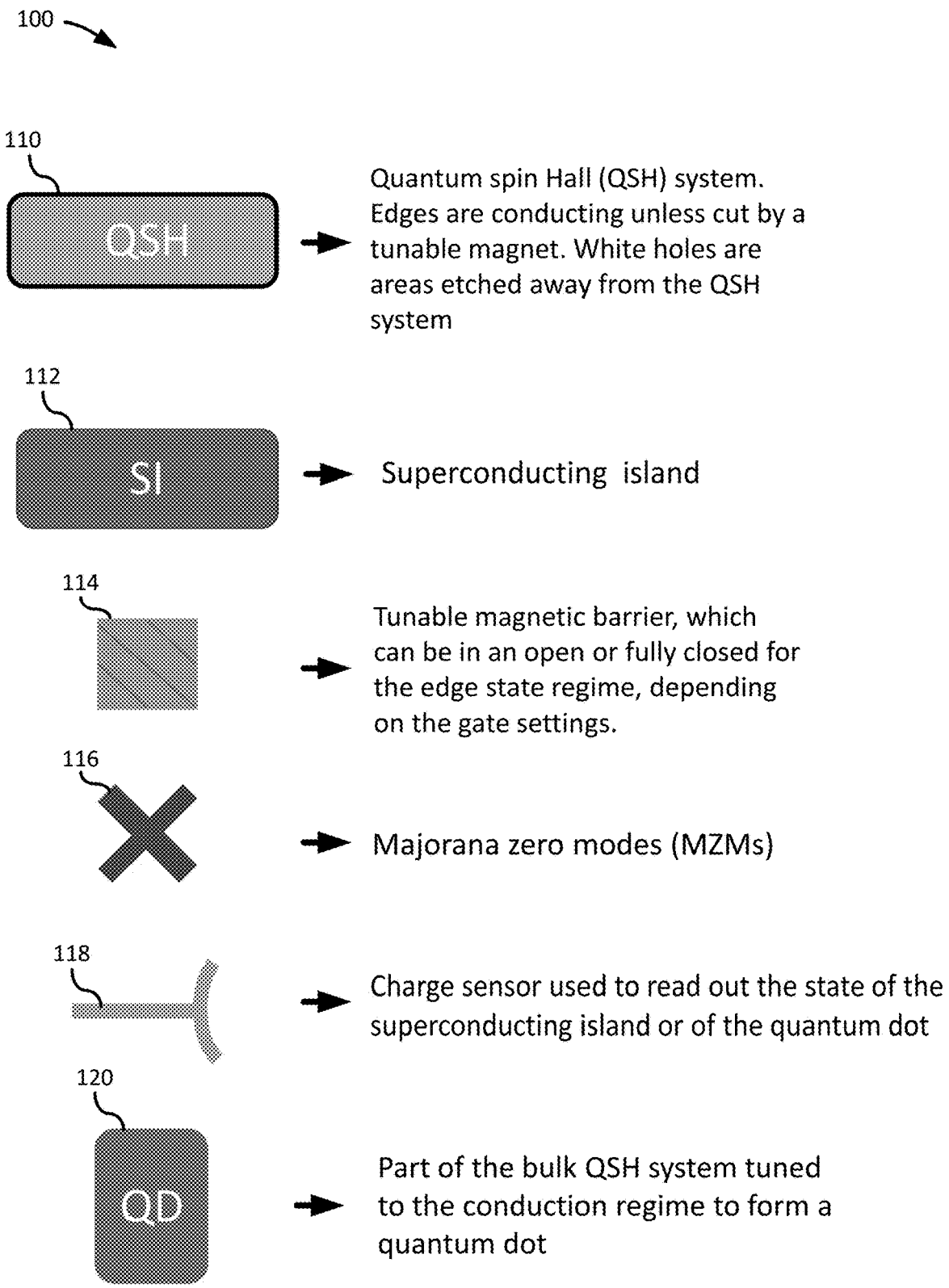
FIG. 1 is a schematic block diagram showing a key to the notation used in FIG. 2-6.

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Various alternatives to the examples described herein are possible. The various aspects of the disclosed technology can be used in combination or separately. Different embodiments use one or more of the described innovations. Some of the innovations described herein address one or more of the problems noted in the background. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Example Embodiments of the Disclosed Technology

In the embodiments below, quantum spin Hall ("QSH") systems are used as examples where the technology can be applied. However, the scope of the technology is not limited to QSH systems. In particular, higher-order topological insulators have states on the hinges similar to the ones the QSH systems have on their edges, hence the edge of the example QSH systems disclosed herein can be replaced with a hinge or atomic step of higher-order topological insulators.

The disclosed examples of the QSH systems can be fabricated, for example, using $WTe_2$ monolayers, HgTe/CdTe quantum wells, and/or InAs/GaSb quantum wells. $WTe_2$ monolayers have the additional property that the superconducting region can be gate-tuned, not fabricated in the sample. Example implementations of the second-order topological insulators comprise Bi.

Quantum spin Hall ("QSH") based systems promise a route toward topological quantum computation by creating an interface with superconductors and magnetic insulators and localizing Majorana zero modes ("MZMs") between them. Current proposals for the realizations of topological qubits in QSH-based system, however, are not in the charging-energy protected regime and are not based on the measurement-only protocol. Additionally, there are no truly scalable proposals due to the 1-dimensional nature of the QSH edge states, where MZMs can be formed. Further, current proposals rely on controlling the magnetic field (locally or globally).

Embodiments of the disclosed technology address the problems of the current proposals by using a tunable quantum dot in the QSH bulk to connect the otherwise disconnected QSH edges, and to make an effective two-dimensional structure out of the edge states. One advantage of such an approach is that the edges remain disconnected unless required by the ongoing measurement. This gives exponentially well disconnected MZMs between quantum computing operations. On top of that, compared to other approaches, fewer gates can be used to control each of the quantum dots (e.g., two fewer gates than in a previous four-gate arrangement).

A further advantage of the disclosed technology is the choice between electric and magnetic control of the tunnel barriers. By aligning the magnetization of the magnet parallel and perpendicular to the spin quantization axis of the QSH edge states, one can control transmission through the barrier. Further embodiments disclosed herein comprise tuning the gate voltage for the local gate near the magnet, thus avoiding the tuning of the magnetic field altogether.

Certain embodiments of the disclosed technology address the issues of the current proposals by providing a charging energy-protected, measurement-only scalable design for qubits in a QSH system. The qubits can be, for example, Majorana hexon qubits or Majorana tetron qubits. Further, some embodiments use a static magnetic insulator.

FIG. 1 is a schematic block diagram 100 showing a key to the notation used in the figures below. In particular, FIG. 1 illustrates the notational scheme used in FIGS. 2-6. As shown at 110, the structural portions shown in green and delineated by "QSH" represent a quantum spin hall system. Further, in the illustrated embodiments, the edges are conducting unless cut by a tunable magnet, and the white holes (shown as rectangular cutouts) are areas etched from the QSH system. As shown at 112, the structural portion shown in blue and delineated by "SI" represent a superconducting island. As shown at 114, the structural portion shown in orange with blue hatches represent a tunable magnetic barrier. The tunable magnetic barrier can be in an open- or fully-closed-for-the-edge-state regime, depending on the gate setting. As shown at 116, the structural portion shown as a red "X" represents a Majorana zero mode ("MZM"), which is also referred to herein as a "Majorana". As shown at 118, the structural portion shown by a semi-circle and a perpendicular branch represents a charge sensor used to read out the state of the superconducting island or of a quantum dot. As shown at 120, the structural portion shown in red and delineated "QD" represents part of the bulk QSH system tuned to the conduction regime to form a quantum dot.

Figure 2:
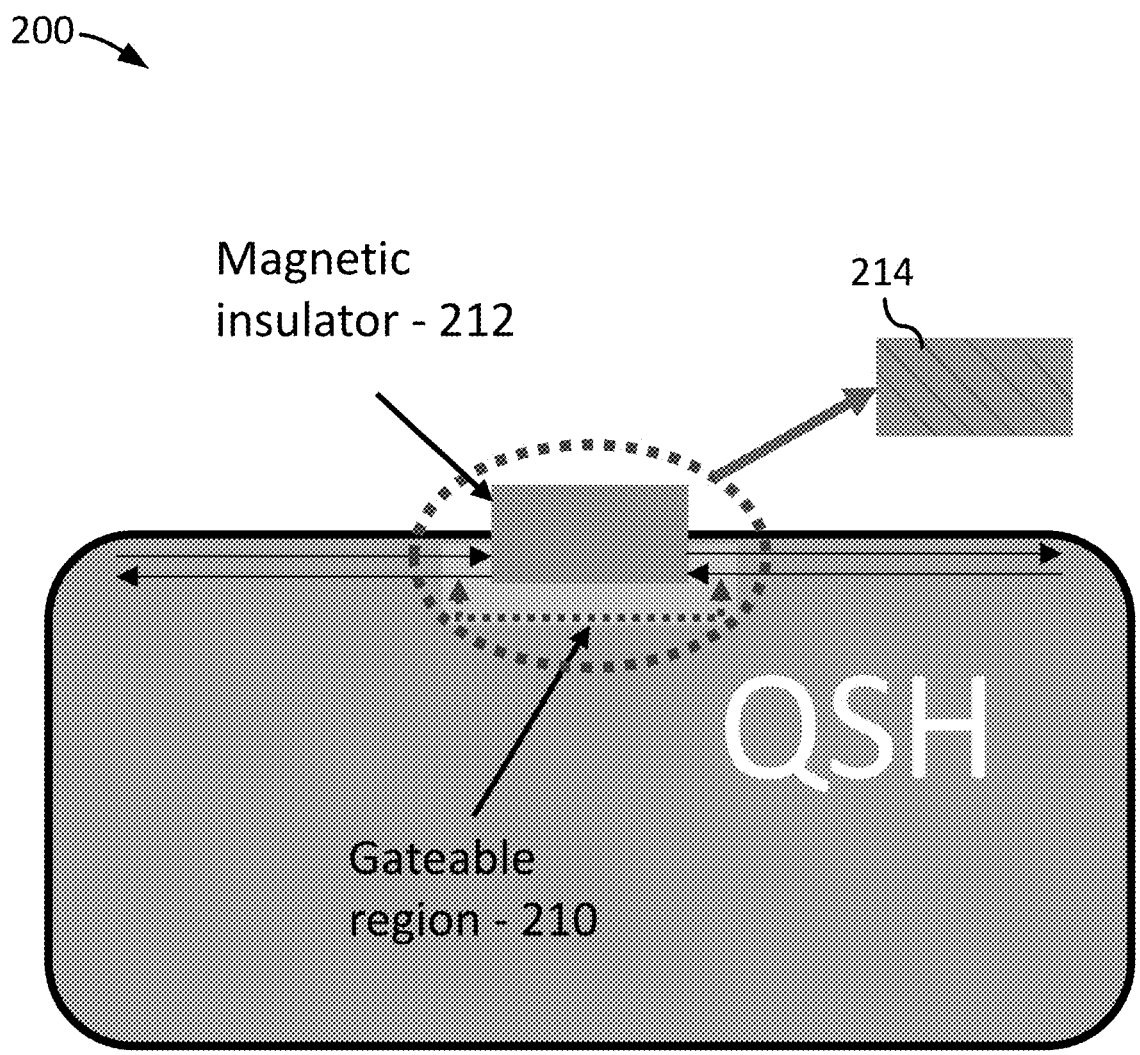
FIG. 2 is a schematic block diagram illustrating an approach to control a magnetic tunnel barrier.

FIG. 2 is a schematic cross-sectional side view 200 illustrating the control of a magnetic tunnel barrier. In general, two approaches can be used to control a magnetic tunnel barrier separating a MZM from the open areas of a QSH edge. A first example approach comprises controlling the magnetization of the magnet by a local high field coil. A second example approach, and as illustrated in FIG. 2, comprises controlling a local gate (denoted as gate region 210) adjacent to the magnet region (shown by magnetic insulator 212) to tune the system into the bulk QSH bands and allow transmission of electrons through the magnetic region (resulting in a tunable magnetic barrier, as illustrated at 214). This second approach has the advantage of allowing full electrical control of the QSH topological qubit system. Further, the size of the magnet region can be a variety of sizes based on the requirements for the tunnel barrier, but in some cases is approximately 100 nm in size.

Figure 3:
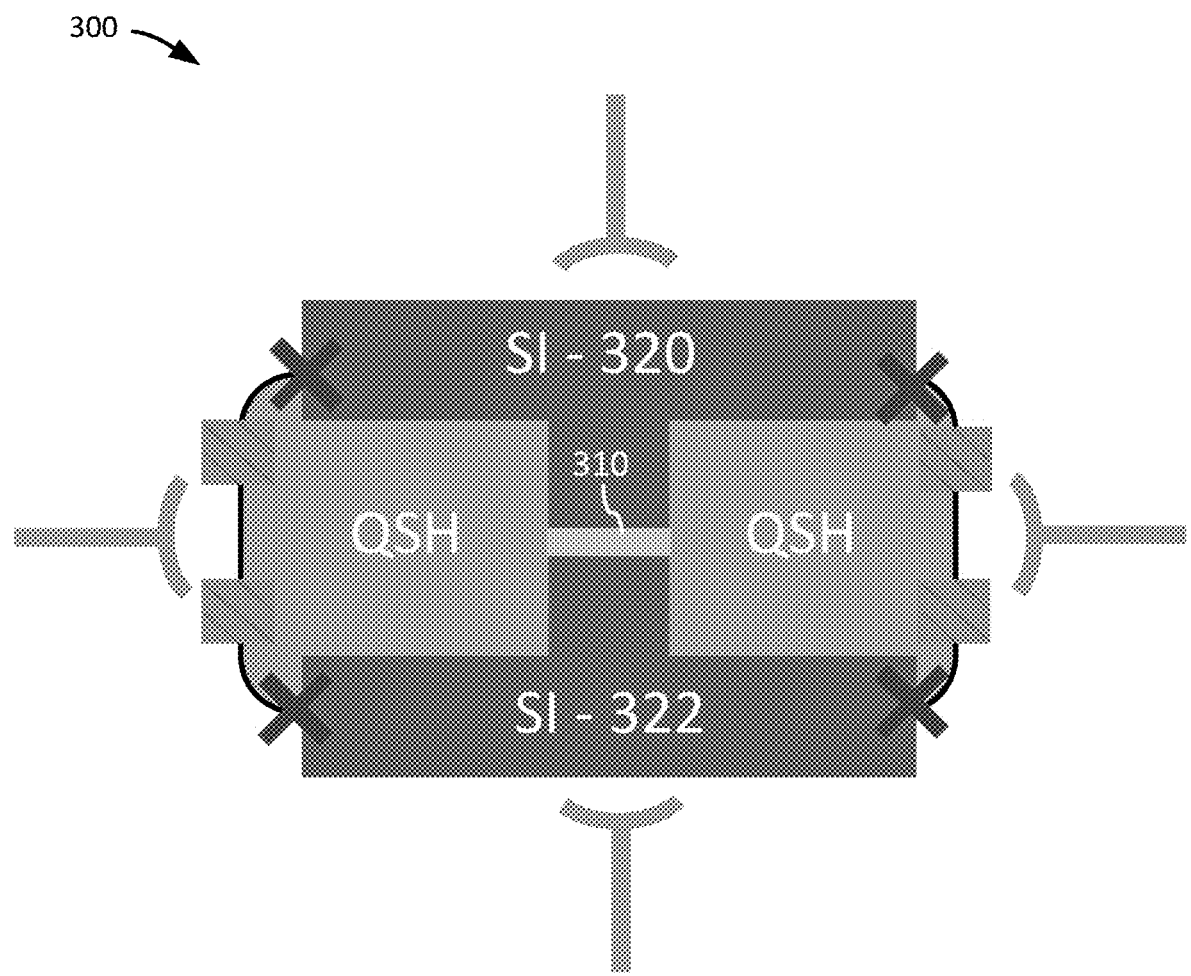
FIG. 3 is a schematic block diagram showing a hybrid design for a tetron (e.g., with all possible measurements).

FIG. 3 is a schematic block diagram 300 showing a top view of a hybrid design for a tetron (e.g., with all possible measurements). The illustrated design relies on a tunable Josephson junction in the middle (shown at 310), which can tune the mutual charging energy of the islands (SI 320 and SI 322) on and off. Unlike in the nanowire case, the absence of an external magnetic field and non-nanowire nature of the junction allows for large tunability of the device. In the figure, measurements are redundant (which is beneficial for testing), but two of the charge sensors can be removed (e.g., one of the top or bottom along with one of the right or left sensors).

Figure 4:
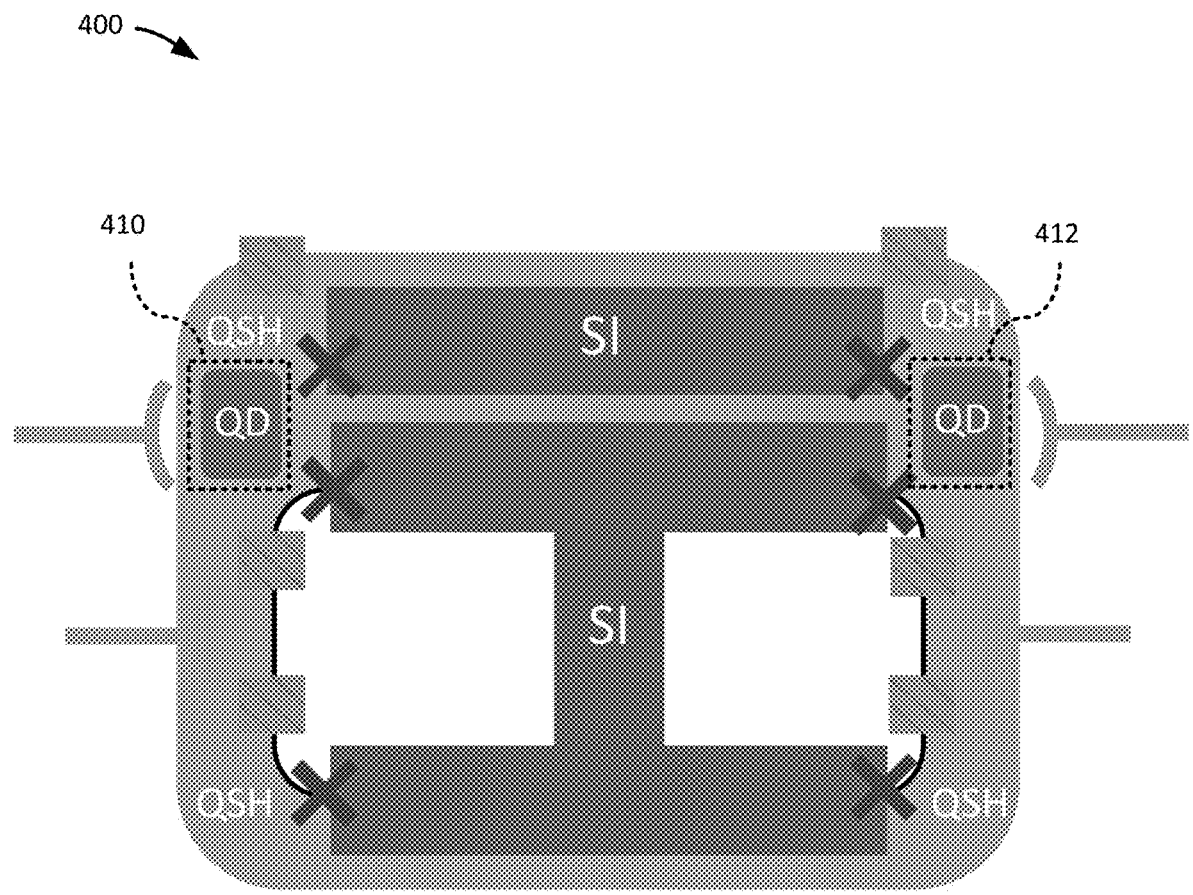
FIG. 4 is a schematic block diagram showing a top view of a quantum dot measurement-only design for a tetron with all possible measurements.

FIG. 4 is a schematic block diagram 400 showing a top view of a quantum dot measurement-only design for a tetron with all possible measurements. The embodiment illustrated in FIG. 4 has the advantage of not requiring a tunable Josephson junction. Instead, the design adds another element to the design: one or more tunable quantum dots. The quantum dot can be created by a gate from bulk QSH by gating it into the bulk conducting regime (either with positive or negative voltage applied to the gate). In FIG. 4, two quantum dots 410, 412 are illustrated. In some embodiments, the measurement of any one or more of the Majoranas is allowed by opening the respective tunnel barriers and tuning one or more of the quantum dots (e.g., as shown at 410 and 412) into the bulk conducting regime. The size of the quantum dots can vary from implementation to implementation, but in some example implementations is between 180 nm and 220 nm. Further, in some example implementations, the distance between opposing edges of the tunable magnetic barriers is between 30 nm and 70 nm.

Example designs for Majorana tetron qubits (sometimes referred to as "quad qubits") that can be realized with and/or otherwise incorporate the disclosed technology are described in, for example, Karzig et al., "Scalable Designs for Quasiparticle-Poisoning-Protected Topological Quantum Computation with Majorana Zero Modes," arXiv: 1610.05289 (March 2017) and T. Karzig et al., "Scalable Designs for Quasiparticle-Poisoning-Protected Topological Quantum Computation with Majorana Zero Modes," Phys. Rev. B 95, 235305 (2017); U.S. patent application Ser. No. 15/636,457 entitled "QUANTUM COMPUTING METHODS AND DEVICES FOR MAJORANA QUAD QUBITS" and filed on Jun. 28, 2017 (published as U.S. Patent Application Publication No. 2018/0052806), and U.S. Provisional Application No. 62/385,245, entitled "QUANTUM COMPUTING METHODS AND DEVICES FOR MAJORANA QUAD QUBITS" filed on Sep. 8, 2016, all of which are incorporated herein by reference in their entirety.

Figure 5:
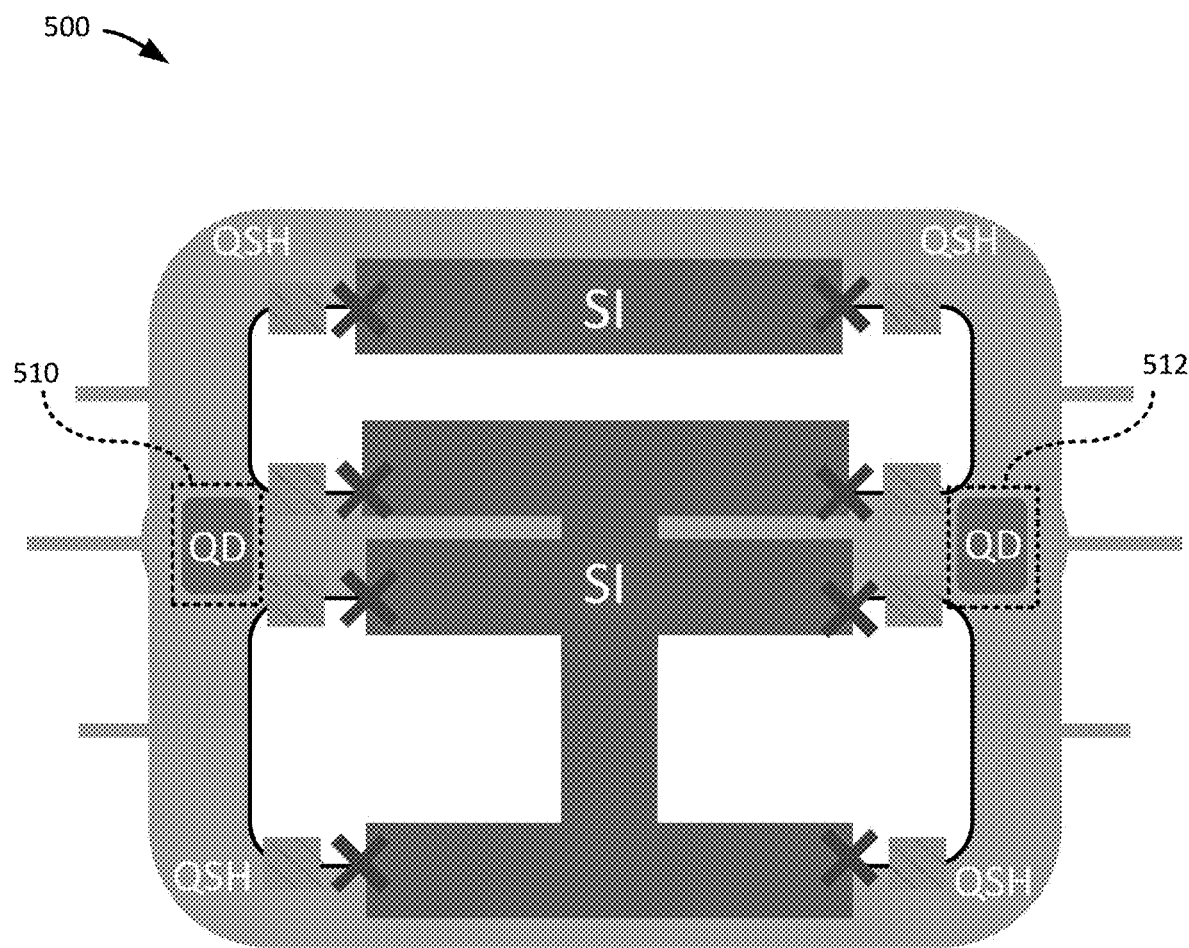
FIG. 5 is a schematic block diagram showing a top view of a quantum dot measurement-only design for a hexon with all possible two-MZM measurements.

FIG. 5 is a schematic block diagram 500 showing a top view of a quantum dot measurement-only design for a hexon with all possible two-MZM measurements. This embodiment allows for measurement of any pair of the Majoranas. For instance, in some embodiments, the measurement of any one or more of the Majoranas is allowed by opening the respective tunnel barriers and tuning one or more of the quantum dots (e.g., as shown at 510 and 512) into the bulk conducting regime.

Figure 6:
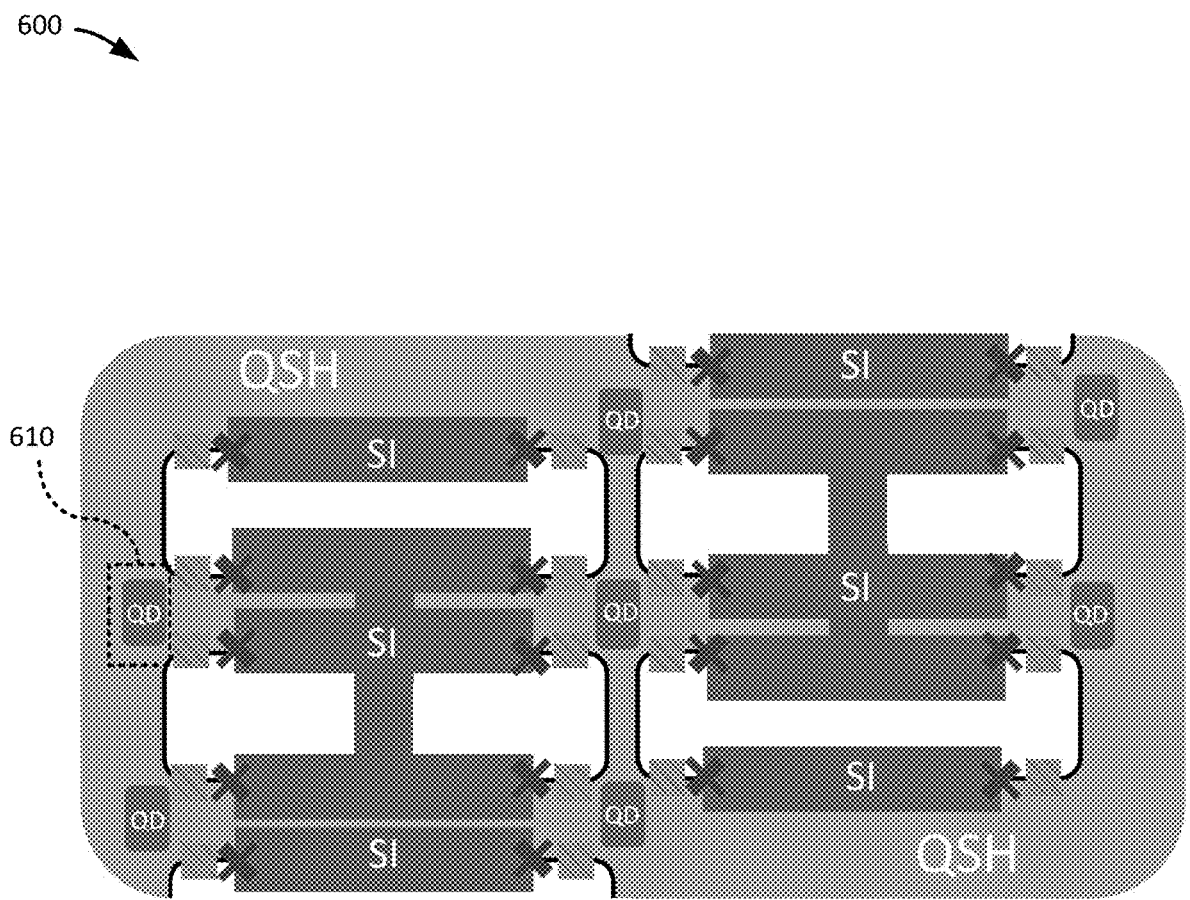
FIG. 6 is a schematic block diagram showing a top view of a Quantum dot measurement-only design for a hexon with all possible two-MZM measurements, where the design has been scaled up.

FIG. 6 is a schematic block diagram 600 showing a top view of a Quantum dot measurement-only design for a hexon with all possible two-MZM measurements, where the design has been scaled up, and thereby illustrates how the design can be scaled up indefinitely. A representative quantum dot is illustrated at 610, but it will be appreciated that multiple instances of the quantum dot are in the illustrated design. In this particular embodiment, the tiling depicted here allows any 4-Majorana measurement to be performed on the two nearby hexon qubits.

Example designs for Majorana hexon qubits that can be realized with and/or otherwise incorporate the disclosed technology are described in, for example, Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes," Phys. Rev. B 95, 235305 (2017); U.S. patent application Ser. No. 15/636,376 entitled "QUANTUM COMPUTING DEVICES WITH MAJORANA HEXON QUBITS" and filed on Jun. 28, 2017 (published as U.S. Patent Application Publication No. 2018/0053809); U.S. Provisional Application No. 62/382,253, entitled "QUANTUM COMPUTING DEVICES WITH MAJORANA HEXON QUBITS" filed on Aug. 31, 2016, all of which are incorporated herein by reference in their entirety.

Figure 7:
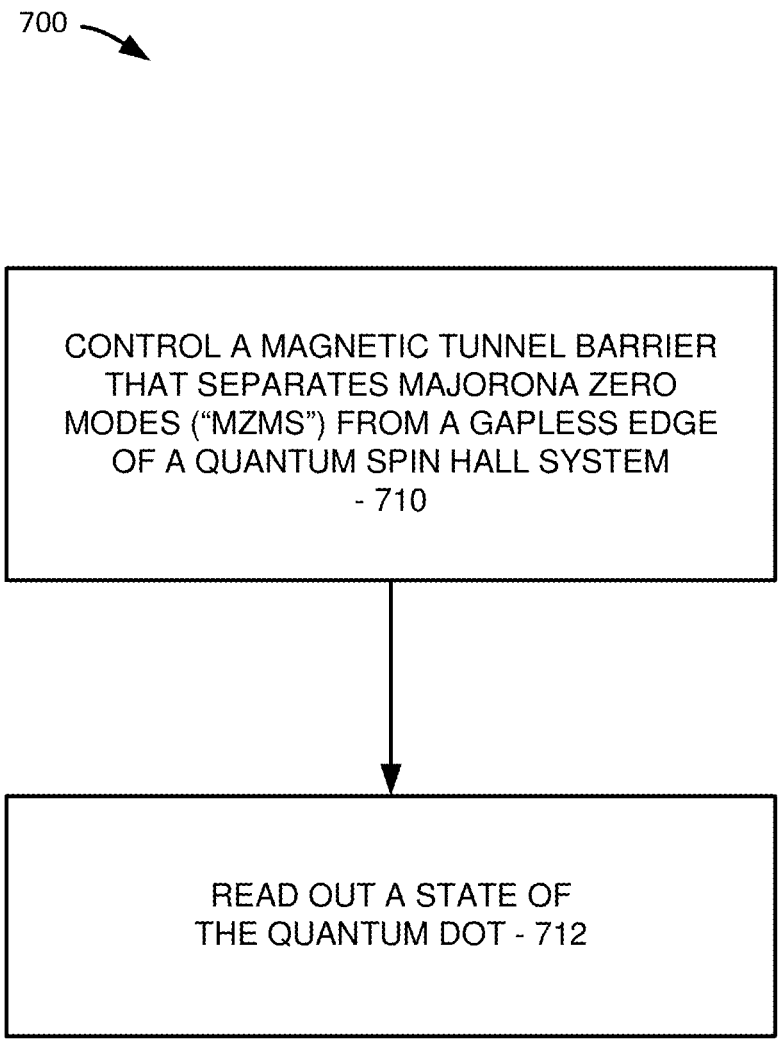
FIG. 7 is a flow chart illustrating an example embodiment for operating quantum device.

FIG. 7 is a flow chart 700 illustrating an example embodiment for operating quantum device. The illustrated actions are shown by way of example only, as any one or more of the actions may be omitted in certain embodiments, performed in a different sequence, performed concurrently, or replaced by some other actions. Also, additional actions may also be included that are not illustrated here.

At 710, a magnetic tunnel barrier is controlled that separates Majorona zero modes ("MZMs") from an edge area (e.g., a gapless edge) of a quantum spin hall system. In certain embodiments, the magnetic tunnel barrier is formed from a pair of magnetic insulators whose magnetization is held constant, and the magnetic tunnel barrier is tuned by controlling a gate controlling the electron density around the magnetic insulator in the QSH plane, thereby forming a quantum dot.

At 712, a state of the quantum dot is read out (e.g., using a charge sensor as disclosed herein).

In some embodiments, the quantum spin hall system implements a tetron qubit. In further implementations, the tetron qubit does not comprise a Josephson junction. In some implementations, the tunable quantum dot is further located between or substantially between two magnetic insulators (e.g., in some implementations, the two magnetic insulators are non-tunable).

In further embodiments, the quantum spin hall system implements a hexon qubit. In some implementations, the hexon qubit does not comprise a Josephson junction. In certain implementations, the tunable quantum dot is further located between or substantially between two magnetic insulators (e.g., in some implementations, the two magnetic insulators are non-tunable).

Further embodiments comprise a tetron qubit that comprises three pairs of Majorana zero modes, wherein the tetron qubit further comprises a tunable quantum dot configured to control a magnetic tunnel barrier between two neighboring Majorana zero modes. In some embodiments, the tetron qubit does not comprise a Josephson junction. In certain embodiments, the tunable quantum dot is further located between or substantially between two magnetic insulators (e.g., in some implementations, the two magnetic insulators are non-tunable). In further embodiments, the tetron qubit is part of a topologically protected quantum computing system.

Still further embodiments comprise a hexon qubit comprising four pairs of Majorana zero modes, wherein the hexon qubit further comprises a tunable quantum dot configured to control a magnetic tunnel barrier between two neighboring Majorana zero modes. In some embodiments, the hexon qubit does not comprise a Josephson junction. In certain embodiments, the tunable quantum dot is further located between or substantially between two magnetic insulators (e.g., in some implementations, the two magnetic insulators are non-tunable). In further embodiments, the hexon qubit is part of a topologically protected quantum computing system.

III. Concluding Remarks

Example designs for Majorana tetron qubits (sometimes also referred to as "quad qubits") and Majorana hexon qubits that can be realized with and/or otherwise incorporate the disclosed technology are described in, for example, Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes," Phys. Rev. B 95, 235305 (2017); U.S. patent application Ser. No. 15/636,457 entitled "QUANTUM COMPUTING METHODS AND DEVICES FOR MAJORANA QUAD QUBITS" and filed on Jun. 28, 2017 (published as U.S. Patent Application Publication No. 2018/0052806); U.S. patent application Ser. No. 15/636,376 entitled "QUANTUM COMPUTING DEVICES WITH MAJORANA HEXON QUBITS" and filed on Jun. 28, 2017 (published as U.S. Patent Application Publication No. 2018/0053809); U.S. Provisional Application No. 62/382,253, entitled "QUANTUM COMPUTING DEVICES WITH MAJORANA HEXON QUBITS" filed on Aug. 31, 2016; and U.S. Provisional Application No. 62/385,245, entitled "QUANTUM COMPUTING METHODS AND DEVICES FOR MAJORANA QUAD QUBITS" filed on Sep. 8, 2016, all of which are incorporated herein by reference in their entirety.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

What is claimed is:

1. A method of operating quantum device comprising:
   controlling a magnetic tunnel barrier that separates Majorona zero modes ("MZMs") from a gapless edge of a quantum spin hall system,
   wherein the magnetic tunnel barrier is formed from a magnetic insulator whose magnetization is held constant, and
   wherein the magnetic tunnel barrier is tuned by controlling a gate controlling the electron density around the magnetic insulator in the QSH plane, thereby forming a quantum dot.

2. The method of claim 1, further comprising reading out a state of the quantum dot.

3. The method of claim 1, wherein the quantum spin hall system implements a tetron qubit.

4. The method of claim 3, wherein the tetron qubit does not comprise a Josephson junction.

5. The method of claim 3, wherein the tunable quantum dot is further located between or substantially between two magnetic insulators.

6. The method of claim 5, wherein the two magnetic insulators are non-tunable.

7. The method of claim 1, wherein the quantum spin hall system implements a hexon qubit.

8. The method of claim 7, wherein the tetron qubit does not comprise a Josephson junction.

9. The method of claim 7, wherein the tunable quantum dot is further located between or substantially between two magnetic insulators.

10. The method of claim 7, wherein the two magnetic insulators are non-tunable.

11. A tetron qubit, comprising three pairs of Majorana zero modes, wherein the tetron qubit further comprises a tunable quantum dot configured to control a magnetic tunnel barrier between two neighboring Majorana zero modes.

12. The tetron qubit of claim 11, wherein the tetron qubit does not comprise a Josephson junction.

13. The tetron qubit of claim 11, wherein the tunable quantum dot is further located between or substantially between two magnetic insulators.

14. The tetron qubit of claim 13, wherein the two magnetic insulators are non-tunable.

15. The tetron qubit of claim 11, wherein the tetron qubit is part of a topologically protected quantum computing system.

16. A hexon qubit comprising four pairs of Majorana zero modes, wherein the hexon qubit further comprises a tunable quantum dot configured to control a magnetic tunnel barrier between two neighboring Majorana zero modes.

17. The hexon qubit of claim 16, wherein the hexon qubit does not comprise a Josephson junction.

18. The hexon qubit of claim 16, wherein the tunable quantum dot is further located between or substantially between two magnetic insulators.

19. The hexon qubit of claim 18, wherein the two magnetic insulators are non-tunable.

20. The hexon qubit of claim 16, wherein the hexon qubit is part of a topologically protected quantum computing system.

* * * * *